United States Patent [19]

Belke, Jr. et al.

[11] Patent Number: 4,465,547

[45] Date of Patent: Aug. 14, 1984

[54] METHOD OF BONDING A POLY (VINYLIDENE FLUORIDE) SOLID TO A SOLID SUBSTRATE

[75] Inventors: Robert E. Belke, Jr.; Raymond A. Shirk, both of N. Syracuse, N.Y.

[73] Assignee: General Electric Company, Syracuse, N.Y.

[21] Appl. No.: 537,059

[22] Filed: Sep. 29, 1983

[51] Int. Cl.³ .................... B29C 17/08; B44C 1/22; C03C 15/00; C23F 1/00

[52] U.S. Cl. .................... 156/629; 156/643; 156/646; 156/645; 156/664; 156/665; 156/668; 156/153; 156/272.2; 204/192 E

[58] Field of Search .............. 156/629, 643, 646, 645, 156/664, 668, 665, 153, 272.2, 272.6; 204/192 E

[56] References Cited

U.S. PATENT DOCUMENTS 3,816,198 6/1974 LaCombe et al. .................... 156/16

OTHER PUBLICATIONS

Lovinger, A. J., "Ferroelectric Polymers", *Science*, vol. 220, No. 4602 Jun. 10, 1983, pp. 1115-1121.
Shaw, H. J. et al., Stanford University, "PVF₂ Transducers", 1980, *Ultrasonics Symposium*, IEEE, pp. 927-940.
Roberts, A. L., Research News "Flexible PVF₂ Film: An Exceptional Polymer for Transducers" *Science*, vol. 200, Jun. 23, 1978, pp. 1371-1374.
Hughson Chemicals "Chemlok ® Primers".
Hughson Chemicals "Chemlok ® Rubber-to-Metal Adhesive Primer", *Product Information*.
Products Research and Chemical Corporation, "Laboratory Product Report on PR-420", Aug. 1979.
Military Specifications, pp. 187-189.
Bassett, D. C., Developments in Crystalline Polymers-1, Poly(Vinylidene Fluoride), pp. 201-215, (Applied Science Publishers).

*Primary Examiner*—William A. Powell
*Attorney, Agent, or Firm*—Richard V. Lang; Carl W. Baker

[57] ABSTRACT

The invention deals with a method of bonding a poly(-vinylidene fluoride) solid to a variety of solid substrates, in an application typically using the piezoelectric properties of the material. The bonding method entails surface preparation of the poly(vinylidene fluoride) by a variety of steps including activation of the surface by plasma etching to cause the surface to wet the adhesive used in the bonding process. The bonding method produces bonds of increased strength and having good electrical properties.

16 Claims, 7 Drawing Figures

METHOD OF BONDING A POLY (VINYLIDENE FLUORIDE) SOLID TO A SOLID SUBSTRATE

CROSS REFERENCE TO RELATED APPLICATION

This application is related to the commonly assigned application entitled "Method of Electroding a Poly(-Vinylidene Fluoride) Solid", of Robert C. Belke, Richard J. Hill, Raymond A. Shirk and David P. Smith, Ser. No. 537,060, filed concurrently herewith.

BACKGROUND OF THE INVENTION

1. Field of the Invention

This invention relates to the bonding of poly(vinylidene fluoride) to a solid substrate, and more particularly to the surface treatment of the poly(vinylidene fluoride) and the substrate and the use of primers and coupling agents to effect the bond.

2. Description of the Prior Art

Poly(vinylidene fluoride) is a polymer which has been found to exhibit "piezoelectric" properties when suitably processed. The term "piezoelectric" is used herein to denote the property of a material by which the application of a mechanical stress to the material produces a potential across the material. The term also connotes the converse property (which is also present to some degree) by which application of a potential through the material produces a stress and resultant mechanical strain. The poly(vinylidene fluoride) material has been found to exhibit the piezoelectric property only after non-random or crystalline molecular orientations have been created, and after polarization has occurred in respect to these oriented molecular constituents. The orientation takes place at room temperature and above, and may be destroyed if care is not exerted in subsequent treatment of the material. Exposure to excessive electric fields or excessive temperature may have this effect. Given that the material has suitable piezoelectric properties for proper use, it is essential that means be found to support it for exposure to the pressure that is to be responded to and for electrical contact to derive the resultant output potential. One such application of this piezoelectric material is to the sensing of acoustic vibrations in sea water, typified by a hydrophone.

An object in such applications is then one of providing a suitable substrate for the poly(vinylidene fluoride) and bonding the two together with adequate bond strength and good electrical contact.

Accordingly, it is an object of the invention to provide a novel method of bonding poly(vinylidene fluoride) to a substrate.

It is another object of the invention to provide a novel method of bonding poly(vinylidene fluoride) to a substrate with improved bond strength.

It is still another object of the invention to provide a novel method of bonding poly(vinylidene fluoride) to a substrate in a piezoelectric application with improved bond strength and facilitating good piezoelectric properties.

These and other objects of the invention will be dealt with in the description which follows. They are achieved in a novel method which includes preparing a poly(vinylidene fluoride) (PVF$_2$) solid for bonding to a solid substrate comprising the steps of abrading the surface to provide an irregular bonding surface, rinsing the surface to remove surface contaminants; plasma etching the surface to create a temporary high energy bonding surface by activated free radical and ionic species of oxygen, while keeping the PVF$_2$ solid at a temperature below the melting point of its crystallites for dimensional stability or below the temperature for reversion to the unpolarized state; and applying a primer to the surface of the PVF$_2$ solid capable of wetting the activated high energy surface of the PVF$_2$, before the temporary high energy bonding surface has deteriorated. The primed surface of the PVF$_2$ is then ready for adhesive bonding to a suitably prepared substrate. Suitable substrates are steel (including stainless steel), brass, copper and aluminum as well as a variety of structural organic compositions. The substrate preparation involves similar steps including abrading the surface, rinsing the surface, and dependent on the substrate, the application of a suitable coupling agent.

The inventive method is also applicable to the case where the adhesive is applied directly to the treated surface of the poly(vinylidene fluoride). In this case, the application of the adhesive must occur before the treated surface has deteriorated, and the adhesive selected must be one that will wet both the treated surface of the poly(vinylidene fluoride) and prepared surface of the substrate.

BRIEF DESCRIPTION OF THE DRAWINGS

The novel and distinctive features of the invention are set forth in the claims appended to the present application. The invention itself, however, together with further objects and advantages thereof, may best be understood by reference to the following description and accompanying drawings, in which:

DESCRIPTION OF THE PREFERRED EMBODIMENT

The method of the present invention is applicable to the bonding of the poly(vinylidene fluoride) ($PVF_2$) solid to a solid substrate as a step in the fabrication of a $PVF_2$ pressure wave transducer.

Figure 1:
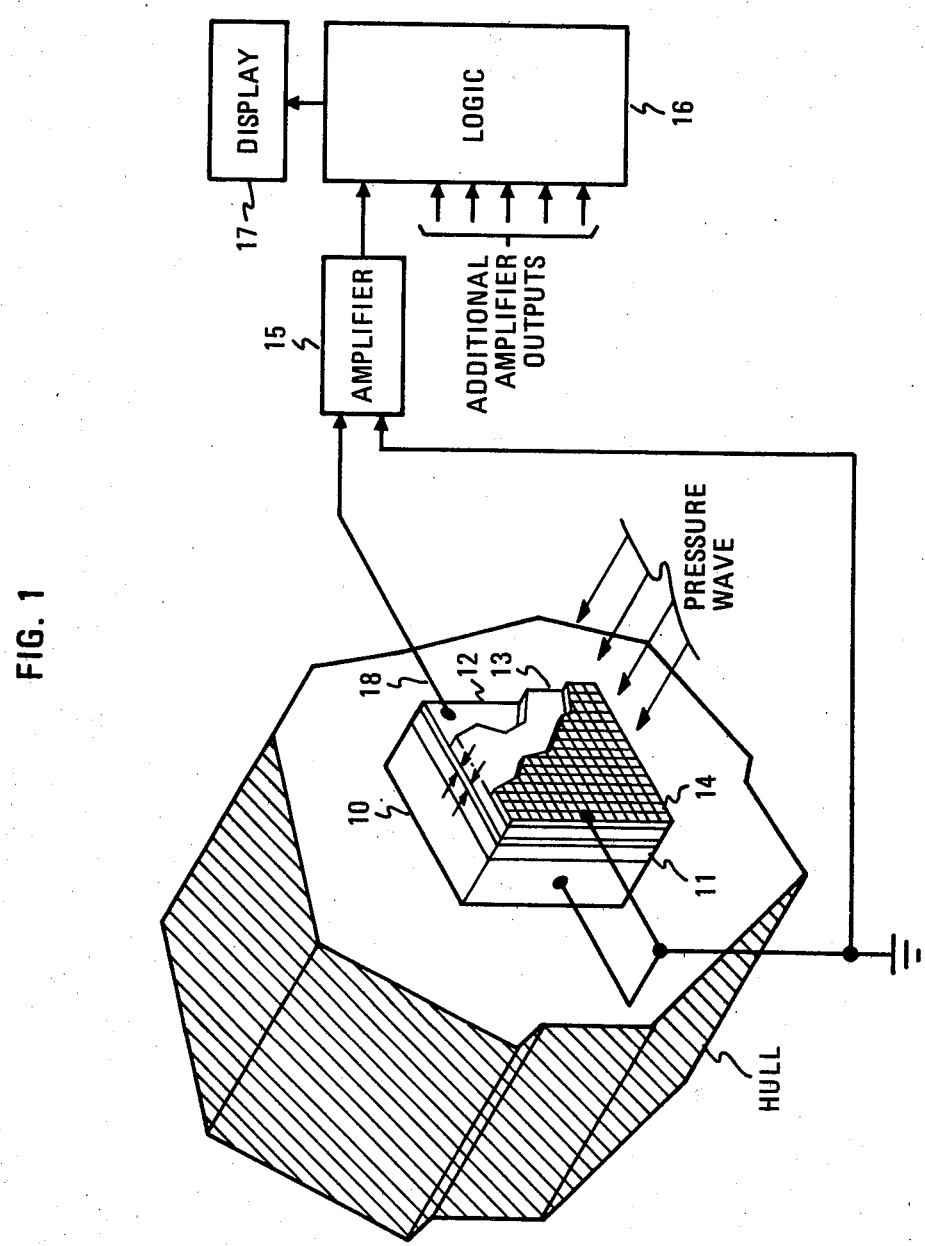
FIG. 1 is an illustration of a pressure wave transducer suitable for use as an element in an array of such elements used as a hydrophone, the transducer employing a poly(vinylidene fluoride) solid having piezoelectric properties bonded to a metallic substrate.

A $PVF_2$ pressure wave transducer is illustrated in FIG. 1, suitable for use as an element in an array of such elements used as a hydrophone. The array consists of large numbers of relatively small (2—$2\frac{1}{2}$") square transducers, typically arranged conformably over a surface on the hull of a ship. The pressure wave transducer in the illustrative application (neglecting details of the bonds) consists of a metallic substrate 10, typically steel, 0.125 inches thick, a first layer 11 of $PVF_2$ attached to the steel substrate, a central electrode 12 bonded to the outer surface of the first, inner layer 11 of $PVF_2$ and to the inner surface of the outer layer 13 of $PVF_2$; the second, outer layer 13 of $PVF_2$; and an outer electrode 14 bonded to the outer surface of the outer $PVF_2$ layer. The $PVF_2$ layers 11 and 13 are typically 0.025 inches thick, and are coextensive with one another. A conductive wire 18, soldered to the central electrode 12, is provided for external signal connection.

The pressure wave transducer in the FIG. 1 application is designed to be attached to the hull of a ship via the substrate 10, with the two $PVF_2$ layers being on the sea water side of the substrate and subjected to the pressure waves propagating in the sea water. Due to the piezoelectric properties of the $PVF_2$ material, the application of hydraulic pressures across the $PVF_2$ layers create potential differences across the layers. When the polarization of layer 11 is inverted in respect to the polarization of layer 13, two potential differences are produced having the same sense when measured at the central electrode 12 in respect to the outermost electrode 14 and the substrate 10. In the illustrated application, the outer electrode 14 and substrate 10 are connected together and grounded, and the potential difference, which occurs as a result of the incidence of a pressure wave upon the transducer, is the signal which may be derived from the central electrode 12 in respect to ground. The output signal of the transducer is coupled to an amplifier 15, and coupled together with the outputs of similar amplifiers similarly connected to other elements of the array. The collected amplified signals are then coupled to signal processing logic 16 for display of the information on the display 17.

In the transducer application, it is essential that the lower $PVF_2$ layer 11 be strongly bonded to the metallic substrate, and that the bond not reduce the potential difference available from the $PVF_2$ layer in relation to ground. This problem is avoided by insuring that the bond between the $PVF_2$ and the substrate be very thin and continuous and/or by using a conductive material in the bond, in the unusual case where an adequately thin bond cannot be achieved.

The method of bonding a $PVF_2$ solid to a metallic substrate as in the application to a transducer element of a hydrophone illustrated in FIG. 1, will now be described with reference to FIGS. 2 and 3.

The steel substrate 20, in the example, is typically a cold rolled, mill steel of low carbon content. (The processing is generally similar for brass, copper and naval bronze.) The surface of the steel prior to treatment has a grey sheen, with a significant specular quality. It is usually available from the supplier coated with an oily, rust inhibiting coating. The surface of the substrate is given a first scrubbing to remove the principal quantity of this oily coating. This scrubbing may be done with an absorbent paper or cloth, with or without a solvent or soap, by wiping the surface.

After scrubbing, the surface of the substrate is abraded until the surface appears to have a dull appearance. The abrasion is preferably by blasting the surface with sand or glass beads, which create random identations into the surface at a depth and density adequate to affect the specular quality of the surface to the eye. The blasting appears to be preferable to conventional sanding, which tends to be directional, while either method of creating an irregular surface enhances the ultimate bond over that of a smooth surface.

After the surface of the steel substrate has been abraded, the surface must be rinsed to remove any remaining surface contaminants. The usual contaminants are hydrocarbons (saturated and unsaturated), fatty esters, fatty acids, including residues of the original rust inhibiting coating, and finger oils. The rinsing is achieved by use of a polar or non-polar solvent, of which there are a large number. Suitable solvents include chlorinated solvents such as 1, 1, 1 trichloroethane, 1, 1, 1 trichloroethylene, methylene chloride; ketons, alcohols, Freon TM solvents, including the TMS and TMC varieties of Dupont.

At this point in the process, the steel substrate has an abraded and cleaned surface suitable for application of an inorganic to organic coupling agent 23 (variously termed an adhesion promoter or a primer). The coupling agent has organic and inorganic constituents making it chemically compatible with organic and inorganic surfaces.

Three classes of coupling agents have been found to be satisfactory for metallic surfaces, such as steel.

One class of examples is that provided by zinc chromate and red lead which are usually referred to as primers. The zinc chromate, or red lead materials are normally highly loaded with inorganic particulates, typically with a vinyl resin binder. The vinyl resin provides adhesion to the steel surface, and the inorganic particulates provide cohesion within the primer. The inorganic particulates also provide an irregular bonding surface which supplements the adhesive effect of the vinyl resin to a later applied adhesive layer. A suitable zinc chromate preparation is available from the Roymal Coating and Chemical Company of Newport, N.H. Due to the existence of the cohesive forces, these materials may be applied to greater thicknesses than conventional coupling agents which are used ideally at near monomolecular thicknesses. A practical upper limit to the thickness of the zinc chromate type coupling agents in a piezoelectric application is due to the diminuition of the electric field. A convenient thickness for such a bond is a few mils.

Another class of coupling agents are those more traditional coupling agents, and which include both organic and inorganic moieties in the same molecule. One subclass of these traditional coupling agents are titanium compounds of the general formula $T_i(OR_4)$ where OR stands for variable organic constituents. Members of this subclass are tetraisobutyl titanate (TBT), or tetra (2-ethyl hexyl) titanate, which is applied for a minimum thickness, nominally monolecular layer.

A second subclass of conventional coupling agents are silane containing materials which are also applied at a minimum thickness. The formulations AP134 and Y5323 of the Hughson Chemical Company, under the trademark "Chemlock" are suitable.

With the coupling agent applied and dry, the steel substrate is now ready for bonding to the $PVF_2$ solid. The drying time is normally in excess of 10 minutes.

The poly(vinylidene fluoride) solid 21 must now be prepared for bonding to the steel substrate. For conventional use as the active piezoelectric material in a pressure wave transducer, the $PVF_2$ should be in the form of a thin sheet, typically 0.025" thick, which has been stretched for dipole orientation and poled to exhibit the desired piezoelectric properties. As procured, the $PVF_2$ sheet has a glossy surface, usually including a mold release.

As is well known, a $PVF_2$ solid contains crystallites of several varieties, which must retain their crystalline state for dimensional stability. While the material has a somewhat undefined "melting" point, due in part to the variability of its solid state, softening occurs at about 156° C. The stretching produces an orientation of the molecular dipoles of the material, and the poling, which proceeds with an indefinite "Curie point", can be accomplished at room temperature, or higher. The degree of poling is dependent in part on the strength and duration of the applied field and in part on the temperature (and the crystalline composition). If the material is subsequently heated above the temperature at which the material is poled, the polarization will diminish due to a relaxation within the material and the piezoelectric coupling will deteriorate. Accordingly, the processing of the bond which will subsequently follow must not exceed the relaxation temperature of the polarized, oriented crystallites. Recognizing that bonding may require some elevation in temperature, polarized, available oriented materials have 50° to 120° C. upper processing limits.

To prepare the surface of the $PVF_2$ sheet for bonding, it may be given a first wiping to remove any gross quantities of surface contaminants, and it is then abraded, preferably by blasting the surface with glass beads or sand, until the surface has lost its gloss, and has approximately #32 surface roughness. As before, the orthogonal blasting appears to give a more uniform bond than sanding which tends to be directional, but either mode of surface abrasion enhances the ultimate bond.

After abrasion, the $PVF_2$ sheet is rinsed with a solvent to remove any remaining surface contaminants such as the mold release and finger oils. A suitable solvent is acetone or alcohol, or any of the solvents listed in connection with the rinsing of the steel substrate.

A major factor in achieving a high strength bond is obtained by plasma etching the surface of the $PVF_2$. This is done with a DC plasma in an $O_2$ atmosphere, at a pressure of 50 microns of mercury with a DC potential of from 500 to 600 volts. The etching is conducted at a current of 0.1 amperes for a period of from 1 to 5 minutes for a 2" by 2" surface.

The process may be conducted with either an ac or a dc plasma. The plasma itself is developed from a low pressure source of oxygen, which under the influence of the electric fields contains activated free radical and ionic species of oxygen. These species include monomolecular oxygen, ozone (trimolecular oxygen) and ionic forms of oxygen. In addition, the etching, which is conducted for a minimum heating of the $PVF_2$ surface, produces some gaseous decomposition products of the $PVF_2$. The etching rate and duration are selected to avoid elevating the temperature of the $PVF_2$ above the temperature at which it reverts to the unpolarized state. As earlier noted, this reversion temperature is a function of the processing of the $PVF_2$ which has preceded.

The voltage, current and pressure for the plasma etching are selected to sustain the ionic and free radicals associated with the plasma in sufficient populations to effect surface energy modification of the $PVF_2$, without gross deterioration of the surface. High plasma densities may permit faster processing, but also increase the temperature of the $PVF_2$ sample and increase the chance for a high temperature induced piezoelectric deterioration. The selection of a relatively low pressure (~50 microns of mercury) permits the surface to be suitably modified for a substantial improvement in the surface energy, and allow the formation of a suitable wetting characteristic at a low enough power dissipation to avoid attacking either the material itself, or depoling the constituent crystallites by excessive heating. The etching rate is approximately proportional to the pressure, and applied field, and the absolute values are dependent on the equipment. A suitable dc plasma etching equipment is disclosed in U.S. Pat. No. 3,816,198 to D. J. LaCombe.

An RF unit available from Plasmoid, Inc. is also suitable. The conditions for operating with an RF plasma must also be adjusted to provide uniform etching over the surface of the $PVF_2$ while avoiding elevation of the temperature above the point at which the material reverts to the unpolarized state. The equipment may be operated at a 50 watt setting for a 2"×2" sample at a pressure of 50 microns of Hg (in an $O_2$ atmosphere). The etching is conducted for a five minute interval. The test for attainment of adequate surface energy for bonding is accomplished by observing whether water wets the surface.

Figure 2:
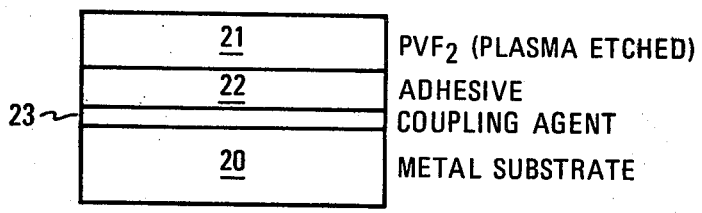
FIG. 2 is a cross-sectional drawing of the bond between a poly(vinylidene fluoride) solid and a metallic substrate (typically steel), in which the PVF$_2$ is subjected to plasma etching to increase the surface energy. An adhesive for bonding the PVF$_2$ solid to the prepared substrate is applied to the activated surface of the PVF$_2$ prior to deterioration.
Figure 3:
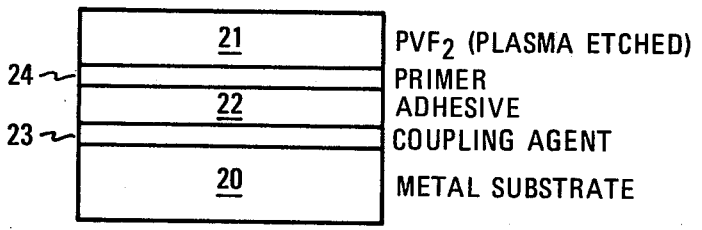
FIG. 3 is a cross-sectional drawing of the bond between a primed plasma etched poly(vinylidene fluoride) solid and a prepared metallic substrate, the priming occurring prior to deterioration of the activated surface, and permitting the bonding of the PVF$_2$ to the metallic substrate to be deferred.

After the $PVF_2$ has been plasma etched, if the process contemplates immediate bonding to the steel substrate, as illustrated in FIG. 2, the adhesive 22 is applied to the plasma etched surface of the $PVF_2$ and to the coupling agent 23 coated upon the prepared steel substrate 20. The bonding adhesive 22 can be one of a relatively large family of adhesives. The adhesives of choice may be selected from several generic classes such as Epoxies, Polyurethanes, Acrylics and Silicones. The selected adhesives should have a moderate to high Young's modulus, a compatible coefficient of thermal expansion with both the substrate and $PVF_2$, and a high bond strength to both prepared surfaces. In other words, the adhesive must wet both the activated surface of the $PVF_2$ and the coated steel substrate (having the coupling agent on the surface thereof). The selected bonding adhesive must not generate or require a bonding temperature in excess of the reversion temperature of the $PVF_2$. A suitable epoxy is the R9-2039/HD3561 system of the Dexter Hysol Company of Olean, New York. The epoxy may be applied and cured at room temperature, the adhesive requiring approximately 6 hours to cure and 24 hours for maximum bond strength.

In the FIG. 2 bond, there are four layers (20, 21, 22, 23) and three interfaces: the interface between the steel substrate 20 and the coupling agent 23 being the first; the interface between the coupling agent 23 and the epoxy adhesive 22 being the second; and the interface between the epoxy adhesive 22 and the plasma etched $PVF_2$ 21 being the third interface. In the cited example, the weakest interface is that between the epoxy and the $PVF_2$. With a lap sheer test, bond strength between the PVF$_2$ (plasma etched) and the epoxy adhesive has exhibited bond strengths from 550 to 1240 lbs. on a 1" square bonded surface. In the example, the coupling agent 23 on the substrate was AP134. Experience has shown that the coupling agent AP134 is effective on steel, brass, aluminum and stainless steel.

A comparable tensile test produces strengths from 2700 to 311 lbs. per square inch using a brass substrate, a wash primer for the brass substrate in a coating process conforming to the MIL-P153228C standard (containing a pigment), and the same epoxy.

The wash primer used for the brass example includes zinc chromate, vinyl butyryl resin binder, phosphoric acid, titanium dioxide and solvents. With a steel substrate designed for sea water submersion, the coating system would typically have three layers, the first of which is a wash primer, and the second of which is red lead in a vinyl binder, and the third of which is an antifoulant (cuprous oxide) also in a vinyl binder.

A suitable "primer" 24 for application to the plasma etched surface of the PVF$_2$ may take the form of of a conventional primer or a thin layer of a suitable adhesive, as defined in relation to the example of FIG. 2, reduced in a solvent. An epoxy, after the two parts have been mixed, may be diluted in a suitable solvent to permit application in a thin uniform coating to the PVF$_2$ surface. The Hughson primers AP134 and Y5323 are suitable. Similarly, the PRC-420 primer of the Products Research Corporation, Glendale, Calif. is suitable.

The strength of the primed PVF$_2$ to adhesive interface, using the cited epoxy, and PRC-420 as a primer (24) in a tensile test produced bond strengths between 1240 and 3100 lbs. per square inch. Using a Hughson AP134 primer, comparable bond strengths between 1600 to 3110 lbs. per square inch were obtained.

Figure 4:
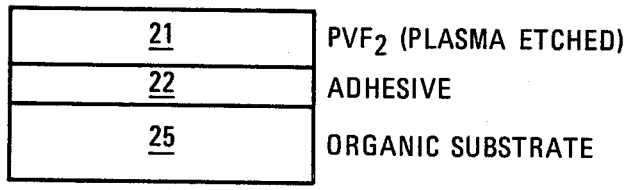
FIG. 4 is a cross-sectional drawing of the bond between an unprimed plasma etched poly(vinylidene fluoride) solid and an organic substrate.
Figure 5:
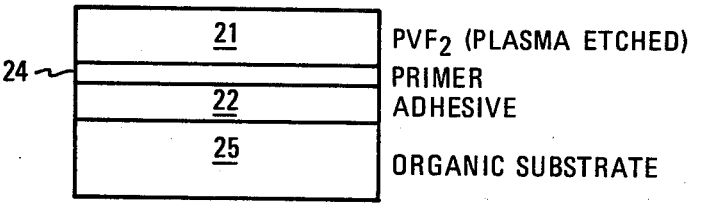
FIG. 5 is a cross-sectional drawing of the bond between a primed plasma etched poly(vinylidene fluoride) solid and an organic substrate.

In the FIG. 4, FIG. 5 examples, an organic substrate 25 is employed. In the simplest example of FIG. 4, the substrate does not require an organic to inorganic coupling agent, and the PVF$_2$ does not require a primer if the bonding is to occur immediately after actuation. For instance, if the substrate 25 is a fibre glass epoxy composite, both the substrate 25 and the treated PVF$_2$ 21 are compatible with many of the common adhesives. In the event that priming is required, the priming choices are essentially the same as occurred in relation to the FIG. 3 embodiment.

In bonding the PVF$_2$ layer to an organic substrate in a piezoelectric application, the underlying electroding of the PVF$_2$ layer may be partial for purposes of stress relief with the unelectroded PVF$_2$ bond to the substrate also being partial, or the electroding may exist in the substrate by use of a conductive organic composition.

Figure 6:
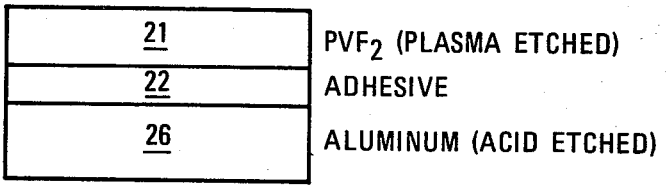
FIG. 6 is a cross-sectional drawing of the bond between unprimed plasma etched poly(vinylidene fluoride) solid and an acid etched aluminum substrate.
Figure 7:
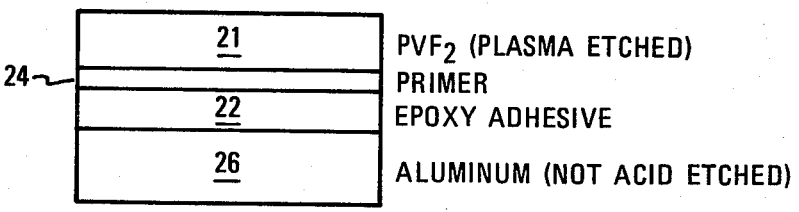
FIG. 7 is a cross-sectional drawing of the bond betwen the primed plasma etched poly(vinylidene fluoride) solid and an aluminum substrate (not acid etched) using an epoxy bonding adhesive.

The case for an aluminum substrate 26, illustrated in FIGS. 6 and 7, is somewhat simplified by the fact that aluminum is readily bonded to. In the first case of FIG. 6, after surface abrasion and rinsing, the aluminum substrate may be acid etched to remove excess oxide and to create surface irregularities. The surfaces may then be bonded together by adhesives 22 lying within the family suggested in relation to the FIG. 2 embodiment. The preferred adhesives 22 for aluminum, however, are the epoxies. In the case that acid etching is not provided, a very strong bond can still be obtained by the use of an epoxy. The primer requirement for the PVF$_2$ is as stated in relation to the FIG. 3 embodiment.

While the invention has been shown in bonding PVF$_2$ to a variety of substrates with primary reference to the piezoelectric application, the material also shows pyroelectric properties, which require an intimate mechanical bond to a heat sink which may also provide one of the electrical contacts.

The poly(vinylidene fluoride) of interest is available in pellet or powder form from a small number of suppliers. One supplier is the Pennwalt Corporation of New Jersey. A suitable product is labeled Kynar 460. The product must be converted from the pellet or powder form to the sheet form.

The activation of the PVF$_2$ surface by the plasma etching process deteriorates with time. The deterioration appears to be not measurable if the primer or adhesive is applied within eight hours after discontinuance of the plasma etching. Early application of the primer or adhesive is advantageous. After a 24 hours period, the beneficial effect of the plasma etching appears to be significantly reduced. The foregoing assumes that the surface is not subject to contact or to air borne contamination.

What is claimed is:

1. The method of preparing a poly(vinylidene fluoride) (PVF$_2$) solid for bonding to a solid substrate comprising the steps of:
   A. providing a PVF$_2$ solid containing crystallites,
      (1) abrading the surface of the PVF$_2$ solid to provide an irregular bonding surface,
      (2) rinsing the surface of the PVF$_2$ solid to remove surface contaminants,
      (3) plasma etching the surface of the PVF$_2$ solid to create a temporary high energy bonding surface by activated free radical and ionic species of oxygen, while keeping the PVF$_2$ solid at a temperature below the melting point of its crystallites for dimensional stability, and
      (4) applying a primer to the surface of the PVF$_2$ solid capable of wetting the activated high energy surface of the PVF$_2$, before the temporary high energy bonding surface has deteriorated.

2. The method of claim 1 wherein:
   said PVF$_2$ contains polarized, oriented crystallites, and wherein:
   the temperature of the PVF$_2$ solid, during plasma etching is kept below that for reversion to the unpolarized state.

3. The method of bonding a poly(vinylidene fluoride) (PVF$_2$) solid to a solid substrate comprising the steps of:
   A. providing a PVF$_2$ solid containing crystallites,
      (1) abrading the surface of the PVF$_2$ solid to provide an irregular bonding surface,
      (2) rinsing the surface of the PVF$_2$ solid to remove surface contaminants, and
      (3) plasma etching the surface of the PVF$_2$ solid by activated free radical and ionic species of oxygen, while keeping the PVF$_2$ solid at a temperature below the melting point of its crystallites for dimensional stability;
   B. providing a solid substrate,
      (1) abrading the surface of the substrate to provide an irregular bonding surface,
      (2) rinsing the surface of the substrate to remove surface contaminants, and
   C. attaching the PVF$_2$ solid to the substrate before the temporary high energy bonding surface has deteriorated by use of an adhesive adherent to the prepared surface of the substrate and capable of wetting the activated high energy PVF$_2$ surface.

4. The method of claim 3 wherein:

said PVF$_2$ solid contains polarized, oriented crystallites, and wherein the temperature of the PVF$_2$ solid, during plasma etching, is kept below that for the reversion to the unpolarized state.

5. The method of bonding a poly(vinylidene fluoride) (PVF$_2$) solid to a metallic substrate comprising the steps of:
  A. providing a PVF$_2$ solid containing crystallites,
    (1) abrading the surface of the PVF$_2$ solid to provide an irregular bonding surface,
    (2) rinsing the surface of the PVF$_2$ solid to remove surface contaminants, and
    (3) plasma etching the surface of the PVF$_2$ solid to create a temporary high energy bonding surface by activated free radical and ionic species of oxygen, while keeping the PVF$_2$ solid at a temperature below the melting point of its crystallites for dimensional stability;
  B. providing a metallic substrate,
    (1) abrading the surface of the substrate to provide an irregular bonding surface,
    (2) rinsing the surface of the substrate to remove surface contaminants, and
    (3) applying a coupling agent to the surface of the substrate with organic and inorganic constituents having an organic to an inorganic coupling affinity; and
  C. attaching the PVF$_2$ solid to the substrate by use of an adhesive adherent to the prepared surface of the substrate and capable of wetting the high energy organic surface before the temporary high energy bonding surface has deteriorated.

6. The method of claim 5 wherein:
said PVF$_2$ solid contains polarized, oriented crystallites, and wherein:
the temperature of the PVF$_2$ during plasma etching is kept below that for reversion to the unpolarized state.

7. The method of bonding a poly(vinylidene fluoride) (PVF$_2$) solid to a metallic substrate comprising the steps of:
  A. providing a PVF$_2$ solid containing crystallites,
    (1) abrading the surface of the PVF$_2$ solid to provide an irregular bonding surface,
    (2) rinsing the surface of the PVF$_2$ solid to remove surface contaminants,
    (3) plasma etching the surface of the PVF$_2$ solid to create a temporary high energy bonding surface by activated free radical and ionic species of oxygen, while keeping the PVF$_2$ solid at a temperature below the melting point of its crystallites for dimensional stability,
    (4) applying a primer to the plasma etched surface of the PVF$_2$ solid before the temporary high energy bonding surface has deteriorated, capable of wetting the activated high energy PVF$_2$ surface,
  B. providing a metallic substrate,
    (1) abrading the surface of the substrate to provide an irregular bonding surface,
    (2) rinsing the surface of the substrate to remove surface contaminants,
    (3) applying a coupling agent to the surface of the substrate having an organic to organic coupling affinity; and
  C. attaching the PVF$_2$ solid to the substrate by use of an adhesive having an organic to organic coupling affinity for adhesion between said primer and coupling agent.

8. The method of claim 7 wherein:
said PVF$_2$ solid contains polarized, oriented crystallites, and wherein:
the temperature of the PVF$_2$ during plasma etching is kept below that for reversion to the unpolarized state.

9. The method of bonding a poly(vinylidene fluoride) (PVF$_2$) solid to a solid organic substrate comprising the steps of:
  A. providing a PVF$_2$ solid containing crystallites,
    (1) abrading the surface of the PVF$_2$ solid to provide an irregular bonding surface,
    (2) rinsing the surface of the PVF$_2$ solid to remove surface contaminants, and
    (3) plasma etching the surface of the PVF$_2$ solid to create a temporary high energy bonding surface by activated free radical and ionic species of oxygen, while keeping the PVF$_2$ solid at a temperature below the melting point of its crystallites for dimensional stability,
  B. providing a solid organic substrate,
    (1) abrading the surface of the substrate to provide an irregular bonding surface,
    (2) rinsing the surface of the substrate to remove surface contaminants, and
  C. attaching the PVF$_2$ solid to the substrate before the temporary high energy bonding surface has deteriorated by use of an adhesive capable of wetting the activated high energy PVF$_2$ surface.

10. The method of claim 9 wherein:
said PVF$_2$ solid contains polarized, oriented crystallites, and wherein:
the temperature of the PVF$_2$ solid, during plasma etching, is kept below that for reversion to the unpolarized state.

11. The method of bonding a poly(vinylidene fluoride) (PVF$_2$) solid to a solid organic substrate comprising the steps of:
  A. providing a PVF$_2$ solid containing crystallites,
    (1) abrading the surface of the PVF$_2$ solid to provide an irregular bonding surface,
    (2) rinsing the surface of the PVF$_2$ solid to remove surface contaminants,
    (3) plasma etching the surface of the PVF$_2$ solid to create a temporary high energy bonding surface by activated free radical and ionic species of oxygen, while keeping the PVF$_2$ solid at a temperature below the melting point of its crystallites for dimensional stability, and
    (4) applying a primer to the plasma etched surface of the PVF$_2$ solid before the temporary high energy bonding surface has deteriorated, capable of wetting the activated high energy PVF$_2$ surface,
  B. providing a solid organic substrate,
    (1) abrading the surface of the substrate to provide an irregular bonding surface,
    (2) rinsing the surface of the substrate to remove surface contaminants, and
  C. attaching the solid PVF$_2$ layer to the organic substrate by use of an adhesive having an organic to organic coupling affinity.

12. The method of claim 11 wherein:
said PVF$_2$ solid contains polarized, oriented crystallites, and wherein:

the temperature of the PVF$_2$ solid, during plasma etching, is kept below that for reversion to the unpolarized state.

13. The method of bonding a poly(vinylidene fluoride) (PVF$_2$) solid to an aluminum substrate comprising the steps of:
   A. providing a PVF$_2$ solid,
      (1) abrading the surface of the PVF$_2$ solid to provide an irregular bonding surface,
      (2) rinsing the surface of the PVF$_2$ solid to remove surface contaminants,
      (3) plasma etching the surface of the PVF$_2$ solid to create a temporary high energy bonding surface by activated free radical and ionic species of oxygen, while keeping the PVF$_2$ solid at a temperature below the melting point of its crystallites for dimensional stability,
   B. providing an aluminum substrate,
      (1) abrading the surface of the aluminum substrate to provide an irregular bonding surface,
      (2) rinsing the surface of the aluminum substrate to remove surface contaminants, and
      (3) acid etching the surface of the aluminum substrate to provide an irregular bonding surface at the metallic grain scale and to remove excess oxide, and
   C. attaching the PVF$_2$ solid to the substrate before the temporary high energy bonding surface has deteriorated by use of an adhesive adherent to the prepared surface of the substrate, and capable of wetting the activated high energy PVF$_2$ surface.

14. The method of claim 13 wherein:
said PVF$_2$ solid contains polarized, oriented crystallites, and wherein:
the temperature of the PVF$_2$ solid, during plasma etching, is kept below that for reversion to the unpolarized state.

15. The method of bonding a poly(vinylidene fluoride) (PVF$_2$) solid to an aluminum substrate comprising the steps of:
   A. providing a PVF$_2$ solid,
      (1) abrading the surface of the PVF$_2$ solid to provide an irregular bonding surface,
      (2) rinsing the surface of the PVF$_2$ solid to remove surface contaminants,
      (3) plasma etching the surface of the PVF$_2$ solid to create a temporary high energy bonding surface by activated free radical and ionic species of oxygen, while keeping the PVF$_2$ solid at a temperature below the melting point of its crystallites for dimensional stability,
   B. providing an aluminum substrate,
      (1) abrading the surface of the substrate to provide an irregular bonding surface,
      (2) rinsing the surface of the substrate to remove surface contaminants, and
   C. attaching the solid PVF$_2$ layer to the aluminum substrate by use of an epoxy adhesive.

16. The method of claim 15 wherein:
said PVF$_2$ solid contains polarized, oriented crystallites, and wherein:
the temperature of the PVF$_2$ solid, during plasma etching, is kept below that for reversion to the unpolarized state.

* * * * *